United States Patent
Shi et al.

(10) Patent No.: US 11,841,738 B2
(45) Date of Patent: Dec. 12, 2023

(54) MULTI-PHASE CLOCK SIGNAL PHASE DIFFERENCE DETECTION AND CALCULATION CIRCUIT AND METHOD AND DIGITAL PHASE MODULATION SYSTEM

(71) Applicant: Montage LZ Technologies (Xiamen) Co., Ltd., Fujian (CN)

(72) Inventors: Mingfu Shi, Fujian (CN); Shunfang Wu, Fujian (CN); Shen Feng, Fujian (CN); Jun Xu, Fujian (CN); Xinwu Cai, Fujian (CN)

(73) Assignee: Montage LZ Technologies (Chengdu) Co., Ltd., Sichuan (CN)

( * ) Notice: Subject to any disclaimer, the term of this patent is extended or adjusted under 35 U.S.C. 154(b) by 522 days.

(21) Appl. No.: 17/134,201

(22) Filed: Dec. 25, 2020

(65) Prior Publication Data
US 2021/0200256 A1    Jul. 1, 2021

(30) Foreign Application Priority Data

Dec. 25, 2019  (CN) .......................... 201911359915.0

(51) Int. Cl.
*H03M 1/82* (2006.01)
*G06F 1/08* (2006.01)
*G06F 1/14* (2006.01)
*G01R 25/00* (2006.01)
*H03K 5/00* (2006.01)
*H03M 1/00* (2006.01)

(52) U.S. Cl.
CPC ............... *G06F 1/08* (2013.01); *G01R 25/00* (2013.01); *G06F 1/14* (2013.01); *H03M 1/82* (2013.01); *H03K 5/00* (2013.01); *H03K 2005/00058* (2013.01); *H03M 1/00* (2013.01)

(58) Field of Classification Search
CPC .. H03M 1/82; H03M 1/00; G06F 1/08; G06F 1/14; H03K 2005/00058; G01R 25/00
See application file for complete search history.

(56) References Cited

U.S. PATENT DOCUMENTS

2011/0169673 A1* 7/2011 Henzler ................ G04F 10/005
341/141

* cited by examiner

*Primary Examiner* — Joseph J Lauture

(57) ABSTRACT

The present disclosure provides a multi-phase clock signal phase difference detection and calculation circuit and method, and a digital phase modulation system. The detection and calculation circuit includes an auxiliary digital-to-time conversion circuit, a main digital-to-time conversion circuit, a phase detector, and a state machine. The auxiliary digital-to-time conversion circuit selects a first phase clock signal and outputs an auxiliary clock signal, adjusts the phase of the auxiliary clock signal; the phase detector detects the phases of the auxiliary clock signal and a target clock signal output by the main digital-to-time conversion circuit; the state machine adjusts the phase of the auxiliary clock signal, and adjusts the phase of the target clock signal. When the phase difference between the two signals is zero, the amount of phase adjustment by the main digital-to-time conversion circuit is the phase difference between the first phase clock signal and the second phase clock signal.

17 Claims, 8 Drawing Sheets

MULTI-PHASE CLOCK SIGNAL PHASE DIFFERENCE DETECTION AND CALCULATION CIRCUIT AND METHOD AND DIGITAL PHASE MODULATION SYSTEM

CROSS REFERENCE TO RELATED APPLICATION

The present application claims the benefit of priority to Chinese Patent Application No. CN2019113599150, entitled "multi-phase clock signal phase difference detection circuit and method, and digital phase modulation system", filed on Dec. 25, 2019, the disclosure of which is incorporated herein by reference in its entirety.

TECHNICAL FIELD

The present disclosure generally relates to circuit design, in particular to a multi-phase clock signal phase difference detection and calculation circuit and method, and a digital phase modulation system.

BACKGROUND

Digital-to-time converters (DTC) are widely used in modules such as phase-locked loops, delay-locked loops, radio frequency transceivers, and various interface clock circuits.

DTCs are used to generate a time delay of a reference signal based on a digital input. The delay of a DTC is composed of a fixed delay time t0 and a variable delay time, and the variable delay time is determined by a digital control word dtc_in, and a gain dtc_gain of a delay line. The delay of DTC tdel is given by $$tdel = t_0 + dtc\_in \cdot dtc\_gain$$

Here, the fixed delay time $t_0$ and the delay line gain dtc_gain both vary substantially with PVT (Process, Voltage and/or Temperature). In applications, in order to have a DTC with high-precision and a full clock cycle range, a variable delay time covering a full clock cycle is required, and the delay line is required to have a sufficient range. However, as dtc_in increases, the linearity of dtc_gain significantly deteriorates. In order to reduce the delay time range of a digitally controlled delay line, multiple orthogonal clock signals can be input by a selector into the digitally controlled delay line, which in turn forms a digitally controlled delay line with multi-phase clock signal input. For example, for a quadrature four-phase clock signal input, the delay time range of the digitally controlled delay line only needs to cover a quarter of the clock cycle to achieve a full cycle range of delay, and at the same time, the linearity of the digitally controlled delay line is improved.

However, the above solution faces a phase mismatch problem caused by the following errors:

1) phase errors between multi-phase clock signals input into the delay line;
2) phase errors generated during signal transmission;
3) phase errors generated when the selector selects different phases.

Phase mismatch makes the actual phase difference between clock signals no longer an ideal 360°/N (N is the number of phases of a multi-phase clock signal), which precludes practical application of this solution.

In a prior art multi-phase clock signal generator (such as a phase locked loop, a divider, a voltage controlled oscillator), as shown in FIG. 1A and FIG. 1B, the generator generates signals including CK_I0, CK_I1, CK_I2, ..., CK_I(N−1). And the phase difference WHT0 between signal CK_I0 and signal CK_I1, the phase difference WHT1 between signal CK_I1 and signal CK_I2, and the phase difference WHT(N−1) between signal CK_I(N−1) and signal CK_I0 may be different from each other.

Therefore, it is important to provide a detection and calculation circuit that can detect and calculate phase differences between clock signals, and then a digital signal processor or decoder can adjust its output digital signals according to the detected and calculated phase differences, so as to cancel a deviation between each detected phase difference and the ideal value of 360°/N.

SUMMARY

An embodiment of the present disclosure provides a multi-phase clock signal phase difference detection and calculation circuit, which includes: an auxiliary digital-to-time conversion circuit, a main digital-to-time conversion circuit, a phase detector, and a state machine.

An output terminal of the auxiliary digital-to-time conversion circuit and an output terminal of the main digital-to-time conversion circuit are respectively connected to an input terminal of the phase detector. An output terminal of the phase detector is connected to an input terminal of the state machine. An output terminal of the state machine is connected to a control terminal of the auxiliary digital-to-time conversion circuit and a control terminal of the main digital-to-time conversion circuit. The auxiliary digital-to-time conversion circuit selects one of a first phase clock signal and a second phase clock signal and outputs an auxiliary clock signal under the control of the state machine, and adjusts the phase of the auxiliary clock signal. The main digital-to-time conversion circuit selects one of a first clock signal and a second clock signal under the control of the state machine. The phase detector compares the phase of the auxiliary clock signal with the phase of a first target clock signal output by the main digital-to-time conversion circuit based on the second phase clock signal as input, and outputs a first phase detection result signal.

The state machine adjusts one of the auxiliary digital-to-time conversion circuit and the main digital-to-time conversion circuit according to the first phase detection result signal until the phase difference between the auxiliary clock signal and the first target clock signal is zero, and keeps an adjusted auxiliary clock signal unchanged. The phase detector compares the phase of the adjusted auxiliary clock signal with the phase of a second target clock signal output by the main digital-to-time conversion circuit based on the first phase clock signal as input, and outputs a second phase detection result signal. The state machine adjusts a delay control signal according to the second phase detection result signal to adjust the phase of the second target clock signal until the adjusted auxiliary clock signal and the second target clock signal have a phase difference of zero according to the phase detector, and then the amount of phase adjustment of the second target clock signal is identified as a phase difference between the first phase clock signal and the second phase clock signal.

Another embodiment of the present disclosure provides a digital-to-time conversion system, which includes a decoder, a multi-phase clock signal generator, which outputs clock signals with different phases included in one clock signal, and a multi-phase clock signal phase difference detection and calculation circuit, which detects and calculates a phase difference between each two of a plurality of phase clock signals. The multi-phase clock signal phase difference detection and calculation circuit comprises an auxiliary digital-to-time conversion circuit, a main digital-to-time conversion circuit, a phase detector, and a state machine.

Another embodiment of the present disclosure provides a method of detecting and calculating phase differences of multi-phase clock signals, which includes: receiving, by an auxiliary digital-to-time conversion circuit, one of a first phase clock signal and a second phase clock signal, and outputting an auxiliary clock signal; instructing a main digital-to-time conversion circuit to selects a second phase clock signal, and to output a first target clock signal; adjusting one of the auxiliary digital-to-time conversion circuit and the main digital-to-time conversion circuit until the phase difference between the auxiliary clock signal and the first target clock signal is zero, and keeping the adjusted auxiliary clock signal unchanged; receiving, by the main digital-to-time conversion circuit, the first phase clock signal again and outputting a second target clock signal; adjusting the phase of the second target clock signal until the phase difference between the second target clock signal and the adjusted auxiliary clock signal is zero; and identifying the amount of phase adjustment of the second target clock signal as a calculated phase difference between the first phase clock signal and the second phase clock signal.

DETAILED DESCRIPTION

One or more specific embodiments of the present disclosure will be described below. These described embodiments are only examples of the presently disclosed techniques, and are not intended to limit aspects of the presently disclosed invention. Additionally, in an effort to provide a concise description of these embodiments, all features of an actual implementation may not be described in the specification. It should be appreciated that in the development of any such actual implementation, numerous implementation-specific decisions must be made to achieve the developers' specific goals, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1A:
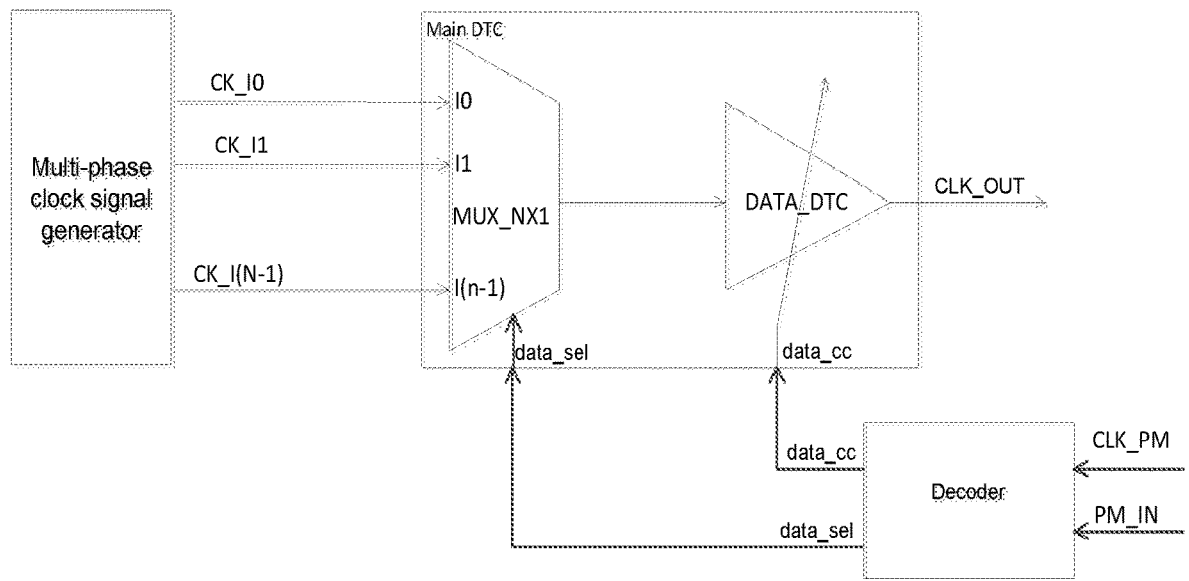
FIG. 1A is a block diagram of a prior art digital-to-time conversion circuit.
Figure 1B:
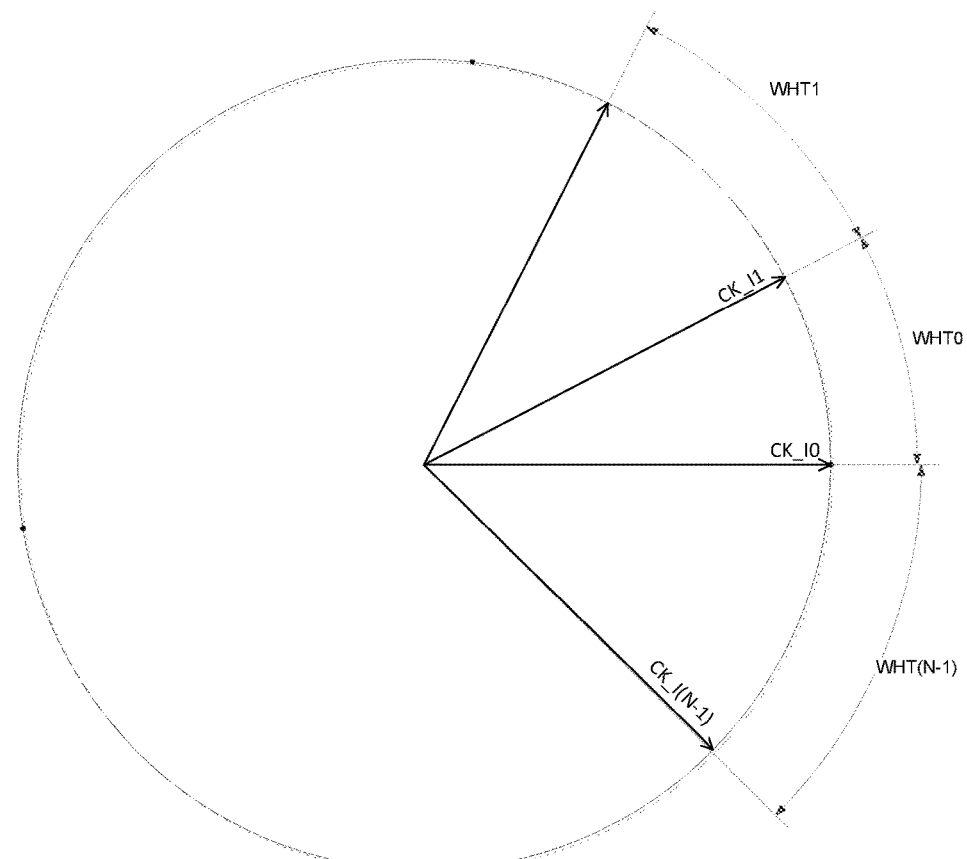
FIG. 1B is a schematic diagram illustrating a phase mismatch problem of a prior art digital-to-time conversion circuit.
Figure 2:
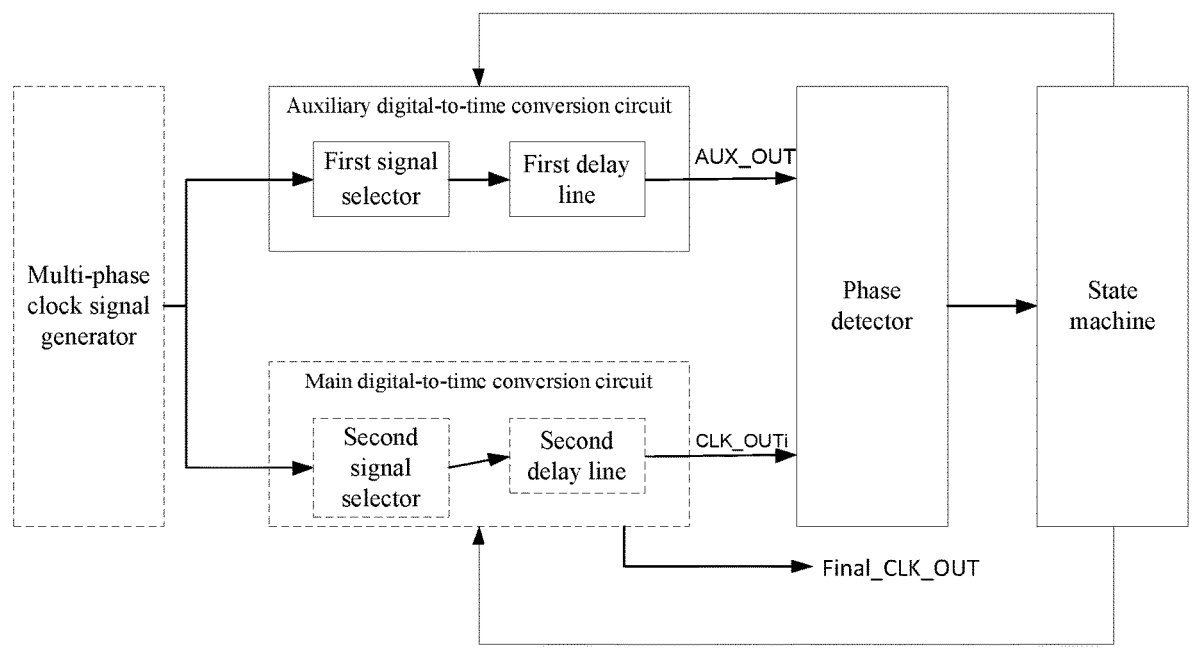
FIG. 2 is a basic block diagram of a multi-phase clock signal phase difference detection and calculation circuit according to one embodiment of the present disclosure.

FIG. 2 shows a multi-phase clock signal phase difference detection and calculation circuit according to one embodiment of the present disclosure. The multi-phase clock signal phase difference detection and calculation includes an auxiliary digital-to-time conversion circuit, a main digital-to-time conversion circuit, a phase detector, and a state machine. An output terminal of the auxiliary digital-to-time conversion circuit is connected to an input terminal of the phase detector, and an output terminal of the main digital-to-time conversion circuit is also connected to the input terminal of the phase detector. An output terminal of the phase detector is connected to an input terminal of the state machine. Output terminals of the state machine are respectively connected to a control terminal of the auxiliary digital-to-time conversion circuit and a control terminal of the main digital-to-time conversion circuit.

The auxiliary digital-to-time conversion circuit, under the control of the state machine, selects one of a first phase clock signal and a second phase clock signal, and outputs an auxiliary clock signal based on the selected clock signal. The auxiliary digital-to-time conversion circuit can adjust the phase of the auxiliary clock signal under the control of the state machine.

The phase detector compares the phase of the auxiliary clock signal with the phase of a first target clock signal output by the main digital-to-time conversion circuit based on the second phase clock signal, which is selected by the main digital-to-time conversion unit, and outputs a first phase detection result signal.

The state machine, according to the first phase detection result signal, controls one of the auxiliary digital-to-time conversion circuit and the main digital-to-time conversion circuit until the phase difference between the auxiliary clock signal and the first target clock signal is zero. The state machine then keeps the auxiliary clock signal unchanged.

More specifically, the phase detector compares the phase of the adjusted auxiliary clock signal and the phase of a second target clock signal output by the main digital-to-time conversion circuit based on the first phase clock signal which is selected by the main digital-to-time conversion unit, and then the phase detector outputs a second phase detection result signal. The state machine, according to the second phase detection result signal, adjusts the phase of the second target clock signal. When the phase detector indicates that adjusted the auxiliary clock signal and the second target clock signal have a phase difference of zero, the amount of phase adjustment of the second target clock signal is identified as a phase difference between the first phase clock signal and the second phase clock signal.

Figure 3:
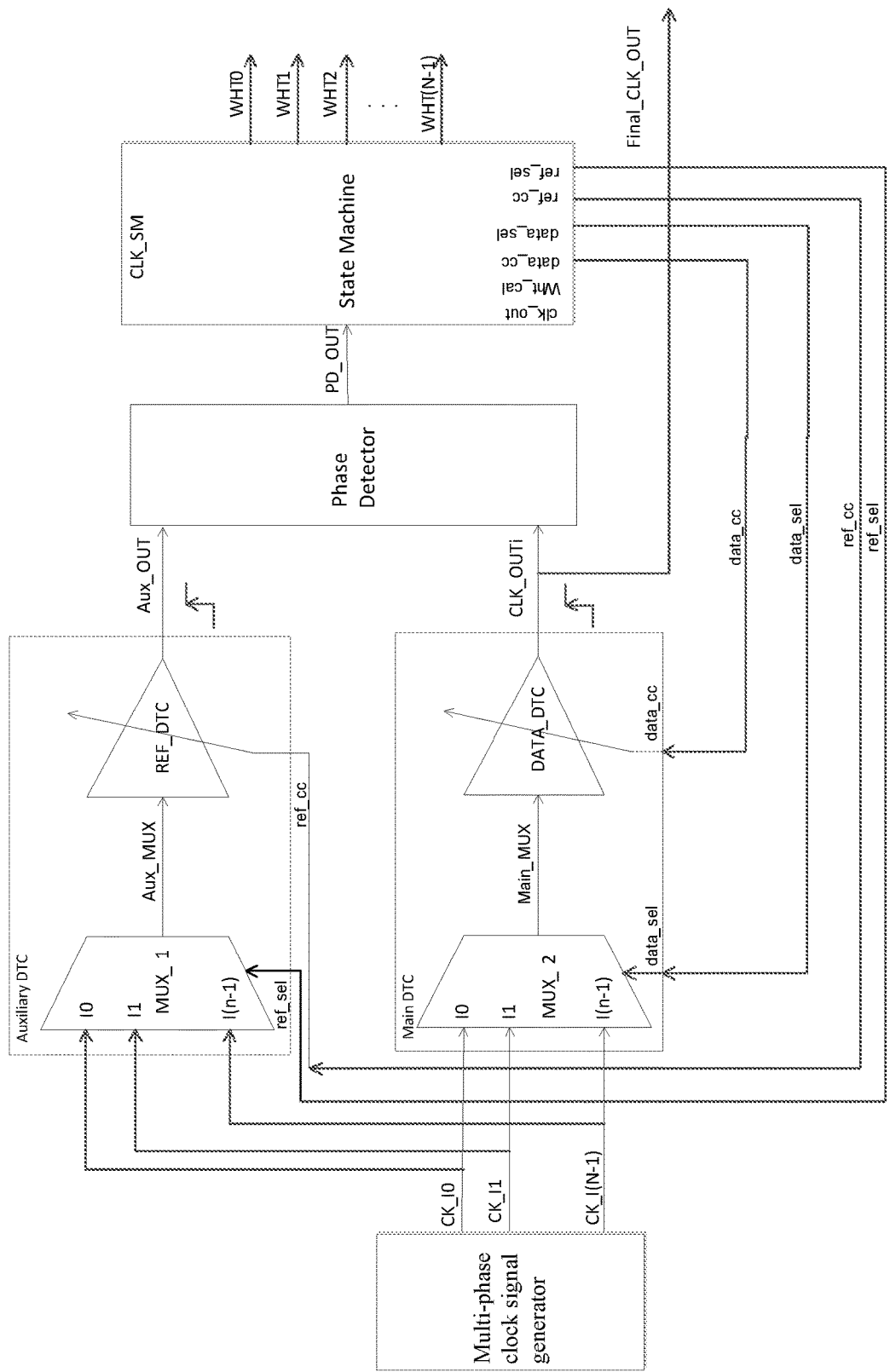
FIG. 3 is a schematic diagram of a multi-phase clock signal phase difference detection and calculation circuit according to one embodiment of the present disclosure.

FIG. 3 is a more detailed diagram of the multi-phase clock signal phase difference detection and calculation circuit. As shown in FIG. 3, the multi-phase clock signal phase difference detection and calculation circuit includes: the auxiliary digital-to-time conversion circuit (Auxiliary DTC), the main digital-to-time conversion circuit (Main DTC), the phase detector, and the state machine. The auxiliary digital-to-time conversion circuit includes: a first signal selector MUX_1 and a first delay line REF_DTC. The subject of detection is phase differences between signals input into the main digital-to-time conversion unit. The main digital-to-time conversion unit (Main DTC) includes a second signal selector MUX_2 and a second delay line DATA_DTC.

More specifically, the output terminal of the auxiliary digital-to-time conversion circuit and the output terminal of the main digital-to-time conversion circuit are connected to the input terminals of the phase detector. An output terminal of the first signal selector MUX_1 is connected to an input terminal of the first delay line REF_DTC, an output terminal of the first delay line REF_DTC is connected to the input terminal of the phase detector, and an output terminal of the second signal selector MUX_2 is connected to an input terminal of the second delay line DATA_DTC, an output terminal of the second delay line DATA_DTC is connected to the input terminal of the phase detector, the output terminal of the phase detector is connected to the input terminal of the state machine. The output terminals of the state machine are respectively connected to the control terminals of the auxiliary digital-to-time conversion circuit, and the main digital-to-time conversion circuit. Specifically, the output terminals of the state machine are respectively connected to control terminals of the first signal selector MUX_1, the first delay line REF_DTC, the second signal selector MUX_2 and the second delay line DATA_DTC.

The phase detector receives clock signals output by the auxiliary digital-to-time conversion circuit and the main digital-to-time conversion circuit, compares the phases of the clock signals, and outputs a phase detection result signal PD_OUT to the state machine. The state machine, according to control procedures, controls phase selection signals, and adjusts one of delay control signals according to the phase detection result signal. More specifically, a first phase selection signal ref_sel is used to control a gate control terminal of the first signal selector MUX_1, in order to select one phase clock signal of multi-phase clock signals generated by a multi-phase clock signal generator as an input signal of the first signal selector MUX_1. A first delay control signal ref_cc controls the first delay line REF_DTC of the auxiliary digital-to-time conversion circuit, to delay or control the phase of an auxiliary clock signal Aux_OUT output by the auxiliary digital-to-time conversion circuit. Similarly, a second phase selection signal data_sel controls a gate control terminal of the second signal selector MUX_2. A second delay control signal data_cc controls the second delay line DATA_DTC of the main digital-to-time conversion circuit, in order to delay or adjust the phase of a target clock signal CLK_OUTi (i=1 or 2) output by the main digital-to-time conversion circuit.

More specifically, the operations of the multi-phase clock signal phase difference detection and calculation circuit according to an embodiment of the present disclosure is schematically described as follows by taking detecting and calculating the phase difference between a first phase clock signal CK_I0 and a second phase clock signal CK_I1 as an example.

Firstly, the state machine, through the first phase selection signal ref_sel, controls the first signal selector MUX_1 to select the first phase clock signal CK_I0 as an output signal of the first signal selector MUX_1, and through the second phase selection signal data_sel, controls the second signal selector MUX_2 to select the second phase clock signal CK_I1 as an output signal of the second signal selector MUX_2. The second delay control signal data_cc is initialized as zero, which means the second delay line is at the minimum delay time; the main digital-to-time conversion circuit outputs the second phase clock signal CK_I1 as a first target clock signal CLK_OUT1; the phase detector compares the phase of the auxiliary clock signal Aux_OUT output by the auxiliary digital-to-time conversion circuit and the phase of the first target clock signal CLK_OUT1 output by the main digital-to-time conversion circuit, and outputs a phase detection result signal PD_OUT; the state machine, according to the phase detection result signal, adjusts the first delay control signal ref_cc (that is, the phase of the auxiliary clock signal Aux_OUT output by the auxiliary digital-to-time conversion circuit is delayed or adjusted, until the phase difference between the auxiliary clock signal Aux_OUT and the first target clock signal CLK_OUT1 is zero, or until the rising edges or falling edges of the auxiliary clock signal Aux_OUT and the first target clock signal CLK_OUT1 are aligned); then the state machine stops adjusting and keeps the state of the first delay line. That is, the values of the first delay control signal ref_cc and the first phase selection signal ref_sel stay unchanged and the phase of the first target clock signal CLK_OUT1 output by the main digital-to-time conversion circuit is "replicated" to the phase of the auxiliary clock signal Aux_OUT.

Secondly, after stopping adjusting the first delay line (that is, the phase of the auxiliary clock signal Aux_OUT is maintained), the state machine adjusts the value of the phase selection signal data_sel of the gate control terminal of the second signal selector MUX_2, and the first phase clock signal CK_I0 is selected as the output signal of the second signal selector MUX_2, and the main digital-to-time conversion circuit outputs a second target clock signal CLK_OUT2. The phase detector compares the phase of the auxiliary clock signal Aux_OUT with the phase of the second target clock signal CLK_OUT2 and outputs the phase detection result signal PD_OUT. The state machine, according to the phase detection result signal, adjusts the delay control signal data_cc of the control terminal of the second delay line DATA_DTC. That is, the phase of the second target clock signal CLK_OUT2 output by the main digital-to-time conversion circuit is delayed or adjusted until the phase difference between the second target clock signal CLK_OUT2 and the auxiliary clock signal Aux_OUT is zero. The state machine stores the amount of phase adjustment of the second target clock signal CLK_OUT2 that is the value of the delay control signal data_cc as a first phase difference WHT0, WHT0 is a calculated phase difference between the first phase clock signal CK_I0 and the second phase clock signal CK_I1.

After obtaining the first phase difference WHT0 between the first phase clock signal CK_I0 and the second phase clock signal CK_I1, a second phase difference WHT1 between the second phase clock signal CK_I1 and a third phase clock signal CK_I2, a third phase difference WHT2 between the third phase clock signal CK_I2 and a fourth phase clock signal CK_I3 . . . until every phase difference between two neighboring phase clock signals (WHT0~WHT(N−1)) is similarly obtained.

Figure 4:
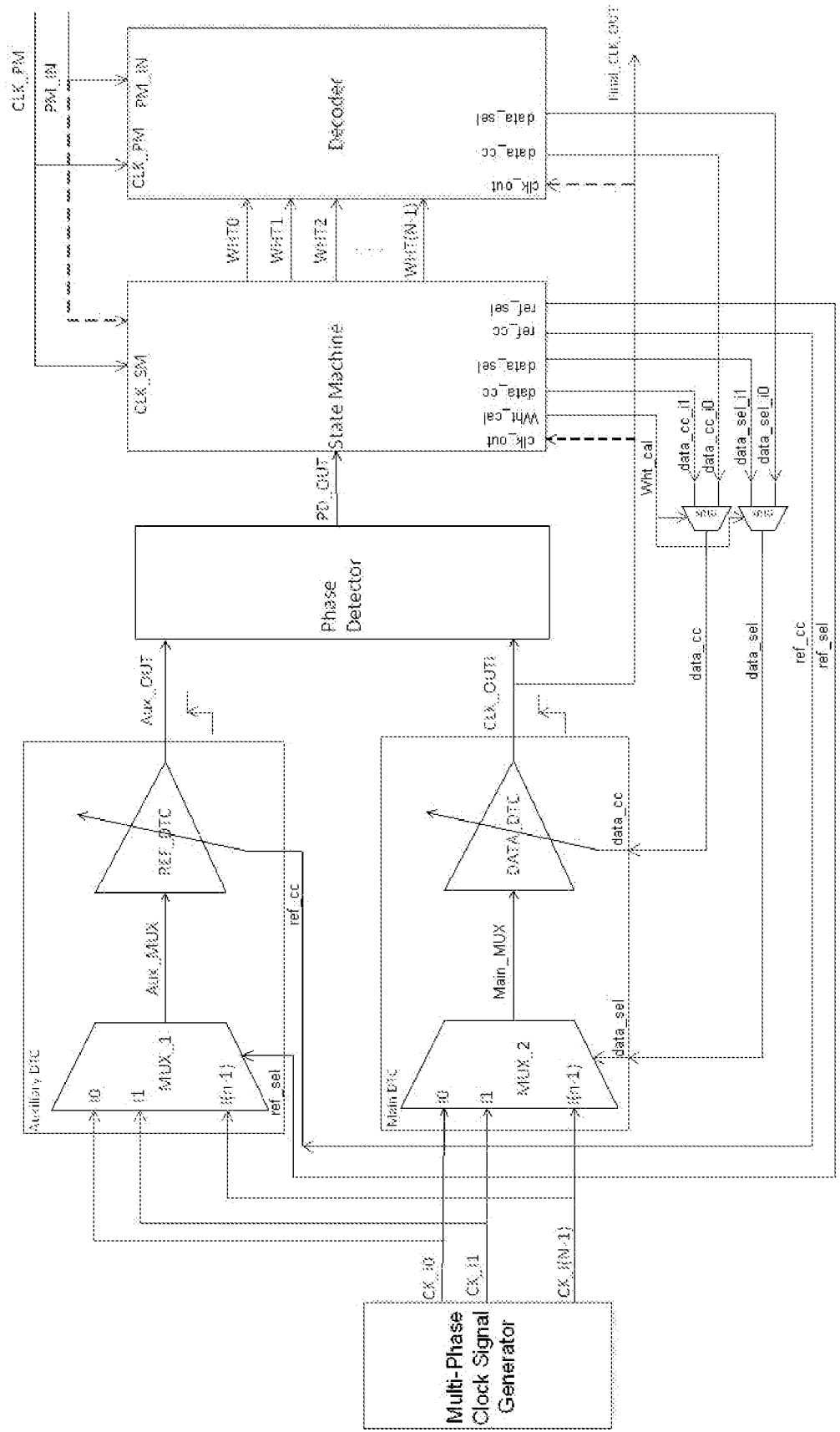
FIG. 4 is a schematic diagram of a multi-phase clock signal phase difference detection and calculation circuit applied to a phase modulator according to one embodiment of the present disclosure.

Turning to FIG. 4, after a decoder recodes an input digital phase signal PM_IN according to the phase differences obtained above, the phase mismatch in the digital domain is canceled. At this point, the calibration process is completed.

Meanwhile, the state machine controls a control terminal Wht_cal of signal selectors mux, making the second delay control signal data_cc and the second phase selection signal data_sel to be controlled by outputs of the decoder.

It should be noted that FIGS. 3 and 4 use four-phase clock signals for illustration purposes only and is not intended to restrict the actual number of phase clock signals and not intended to limit the scope of the invention, and the clock signals can be any multi-phase clock signals.

In some embodiments, the state machine can also work periodically and intermittently in a normal working mode after the detection, calculation and calibration processes, to fine-tune the values of WHT0~WHT(N−1) to overcome, for example, temperature drift's impact.

Taking a four-phase clock signal input as an example, the multi-phase clock signal generator simultaneously outputs four signals CKI0, CKI90, CKI180, and CKI270 with the same frequency but different phases. In theory, the phases of the four signals CKI0, CKI90, CKI180, and CKI270 should be 0°, 90°, 180°, and 270° respectively, but in reality their phases will be, for example, 10°, 88°, 175°, and 280°, there is a phase deviation. In order to eliminate the phase deviation, it is required to detect and calculate the phase difference between 10° and 88° which is 78°, the phase difference between 88° and 175° which is 87°, the phase difference between 175° and 280° which is 105°, and the phase difference between 280° and 360° which is 80°. The detected and calculated phase differences are input into the decoder for decoding, so that the multi-phase clock signal phase difference detection and calculation circuit can be in turn adjusted according to the decoder's decoding result, thereby eliminating adverse effects caused by the deviation.

In order to detect and calculate the phase difference between CKI0 and CKI90, first, the state machine, through the first phase selection signal ref_sel, controls the first signal selector MUX_1 to select the first phase clock signal CK_I0 as the output signal of the first signal selector MUX_1; and the state machine, through the second phase selection signal data_sel, controls the second signal selector MUX_2 to select the phase clock signal CK_I90 as the output signal of the second signal selector MUX_2.

Second, the delay control signal data_cc is initialized to zero, which means the second delay line is at the minimum delay time; the main digital-to-time conversion circuit outputs the phase clock signal CK_I90 as the first target clock signal CLK_OUT1; the phase detector compares the phase of the auxiliary clock signal Aux_OUT output by the auxiliary digital-to-time conversion circuit, and the phase of the first target clock signal CLK_OUT1 output by the main digital-to-time conversion circuit, and outputs the phase detection result signal PD_OUT; the state machine, according to the phase detection result signal, adjusts the delay control signal ref_cc. The state machine delays or adjusts the phase of the auxiliary clock signal Aux_OUT output by the auxiliary digital-to-time conversion circuit, until the phase difference between the auxiliary clock signal Aux_OUT and the first target clock signal CLK_OUT1 is zero, that is, until the rising edges or the falling edges of the auxiliary clock signal Aux_OUT and the first target clock signal CLK_OUT1 are aligned. Then the state machine stops adjusting and keeps the state of the first delay line (that is, the values of the first delay control signal ref_cc and the first phase selection signal ref_sel stay unchanged); then the phase of the first target clock signal CLK_OUT1 output by the main digital-to-time conversion circuit is replicated as the phase of the auxiliary clock signal Aux_OUT.

Third, after the state machine stops adjusting the first delay line (that is, the phase of the auxiliary clock signal Aux_OUT is maintained), the value of the second phase selection signal data_sel, provided to the gate control terminal of the second signal selector MUX_2, is adjusted by the state machine, and the first phase clock signal CK_I0 is selected as the output signal of the second signal selector MUX_2, and as the second target clock signal CLK_OUT2 output by the main digital-to-time conversion circuit.

Fourth, the phase detector compares the phase of the auxiliary clock signal Aux_OUT and the phase of the second target clock signal CLK_OUT2, and outputs a phase detection result signal PD_OUT. The state machine, according to the phase detection result signal, adjusts the second delay control signal data_cc. That is, the state machine delays or adjusts the phase of the second target clock signal CLK_OUT2 output by the main digital-to-time conversion circuit until the second target clock signal CLK_OUT2 and the auxiliary clock signal Aux_OUT have a phase difference of zero. The state machine stores the amount of phase adjustment of the second target clock signal CLK_OUT2 that is the value of the delay control signal data_cc as a first phase difference WHT0, WHT0 is a calculated phase difference between the first phase clock signal CK_I0 and the clock signal CK_I90.

Then, similar operations are adopted to detect and calculate the phase difference WHT11 between the phase clock signal CK_I90 and the phase clock signal CK_I180, the phase difference WHT21 between the phase clock signal CK_I80 and the phase clock signal CK_I270, and the phase difference WHT03 between the phase clock signal CK_I270 and the phase clock signal CK_I360.

It is worth noting that, the reason for replicating the phase of signals output by the main digital-to-time conversion circuit to the phase of signal output by the auxiliary digital-to-time conversion circuit is that although the auxiliary digital-to-time conversion circuit and the main digital-to-time conversion circuit have the same structure, a component used in the auxiliary digital-to-time conversion circuit and a corresponding component used in the main digital-to-time conversion circuit may have different performance due to manufacturing variation between the components. Therefore the replication by the auxiliary digital-to-time conversion circuit helps to avoid errors caused by manufacturing variation.

In some embodiments, as shown in FIG. 3 and FIG. 4, the target clock signal CLK_OUT output by the main digital-to-time conversion circuit is the system's final output signal Final_CLK_OUT.

Figure 5:
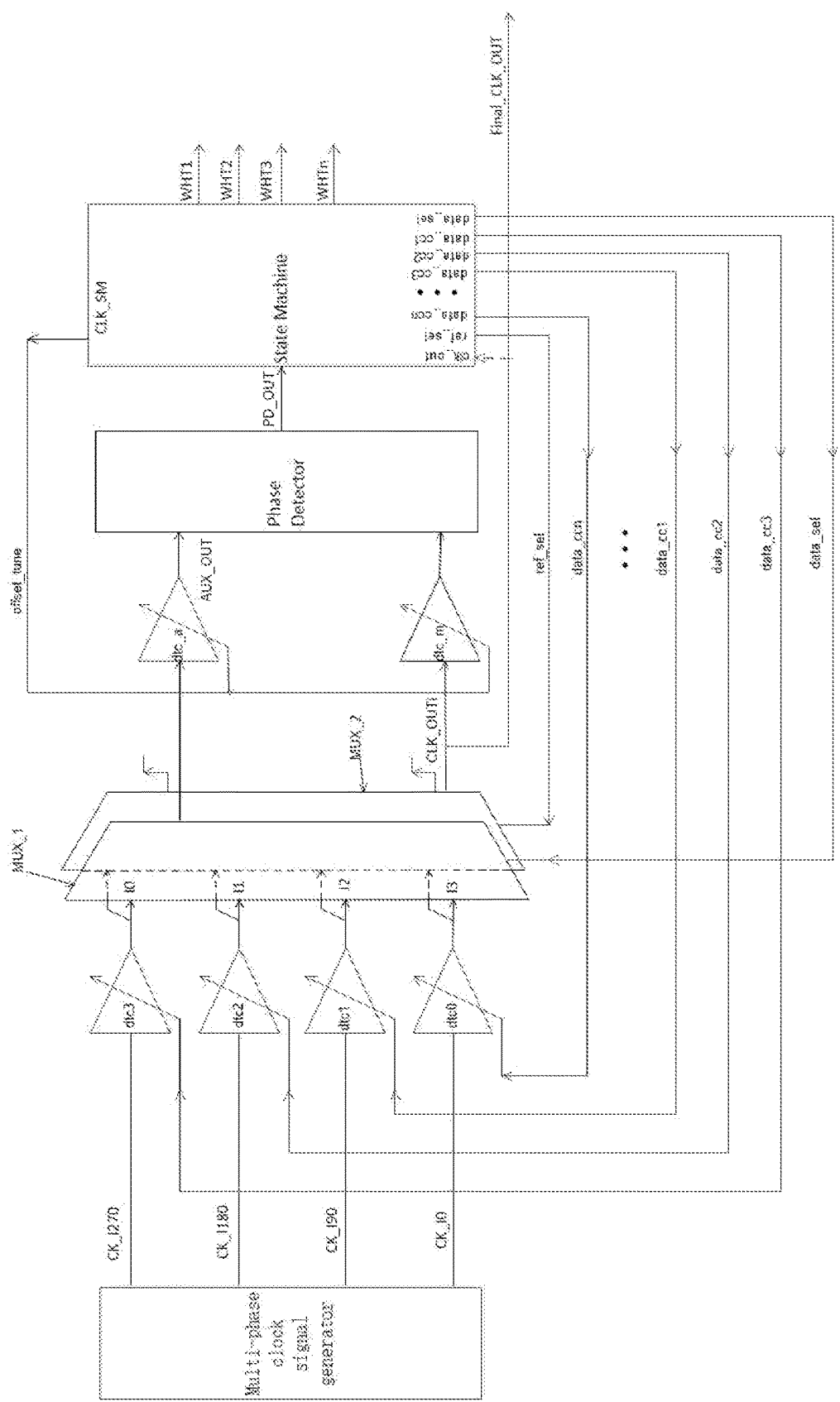
FIG. 5 is a schematic diagram of a multi-phase clock signal phase difference detection and calculation circuit according to another embodiment of the present disclosure.

FIG. 5 shows a multi-phase clock signal phase difference detection and calculation circuit according to another embodiment of the present disclosure. Compared to the circuit shown in FIG. 4, the circuit shown in FIG. 5 further includes a delay circuit. The delay circuit includes a plurality of third delay lines, each of which receives a phase clock signal of multi-phase clock signals. The auxiliary digital-to-time conversion circuit and the main digital-to-time conversion circuit are both connected to an output terminal of the delay circuit. The state machine is connected to a control terminal of the delay circuit, in order to control the delay circuit by adjusting a delay control signal. The auxiliary digital-to-time conversion circuit includes the first signal selector MUX_1 and a first delay line dtc_a. The main digital-to-time conversion circuit includes the second signal selector MUX_2 and a second delay line dtc_m.

Taking a four-phase clock signal as an example. In some embodiments, the delay circuits includes four third delay lines dt0~dt3, the number of which matches the number of phase clock signals to be detected. An input terminal of each third delay line is provided with a phase clock signal, and an output terminal of the third delay lines is connected to the input terminal of the first signal selector MUX_1 and the input terminal of the second signal selector MUX_2. Under the control of the state machine, the first signal selector MUX_1 and the second signal selector MUX_2 select and output a same phase clock signal (for example, both select and output clock signal CK_I90), and the first delay line dtc_a is adjusted to make the phase of a signal output by the first delay line dtc_a to align with the phase of a signal output by the second delay line dtc_m, which has substantially the same effect as the phase replication in the embodiments shown in FIGS. 3 and 4.

It should be noted that FIG. 5 uses four-phase clock signals for illustration purposes only and is not intended to restrict the actual number of phase clock signals and not intended to limit the scope of the invention, and the clock signals can be any multi-phase clock signals.

The phase difference between CK_I0 and CK_I90 is detected and calculated by the following operations:

First, the state machine sets the phase selection signals to be 1 (data_sel=ref_sel=1) and sets a delay control signal data_cc1 to be 0; the phase clock signal CK_I90 is sent to the output terminals of the first signal selector MUX_1 and the second signal selector MUX_2. The state machine controls the first signal selector MUX_1 to select the phase clock signal CK_I90 as the output signal of MUX_1, and controls the second signal selector MUX_2 to select the phase clock signal CK_I90 as the output signal of MUX_2.

Second, the state machine, according to the phase detection result signal PD_OUT output by the phase detector, controls the value of a delay control signal offset_tune (that is, adjust delay or phase of the first delay line dtc_a in the auxiliary digital-to-time conversion circuit or the second delay line dtc_m in the main digital-to-time conversion circuit) until the phase detection result signal PD_OUT shows that the phase of the auxiliary clock signal Aux_OUT and the phase of the first target clock signal CLK_OUT1 are aligned. At this point, errors of the phase detector are eliminated.

Third, the state machine sets the second phase selection signal data_sel to be 0, the first phase selection signal ref_sel to be 1, the delay control signal data_cc1 to be 0. Then, the first phase clock signal CK_I0 is sent to the output terminal of the second signal selector MUX_2, and CK_I90 remains in the output terminal of MUX_1. That is, the state machine controls the first signal selector MUX_1 to keep the second phase clock signal CK_I90 as the output signal of MUX_1, and controls the second signal selector MUX_2 to select the first phase clock signal CK_I0 as the output signal of MUX_2.

Fourth, the state machine adjusts a delay control signal data_cc0 to control the delay of a third delay line dtc_0 in order to adjust the phase of the second target clock signal CLK_OUT2 until the phase detection result signal PD_OUT shows that the second target clock signal CLK_OUT2 and the auxiliary clock signal Aux_OUT have aligned phases. Then, the value of data_cc0 is WHT0.

Subsequently, in the same manner, the phase difference WHT1 between CK_I90 and CK_I180, the phase difference WHT2 between CK_I180 and CK_I270, and the phase difference WHT3 between CK_I270 and CK_I360 are detected and calculated.

Figure 6:
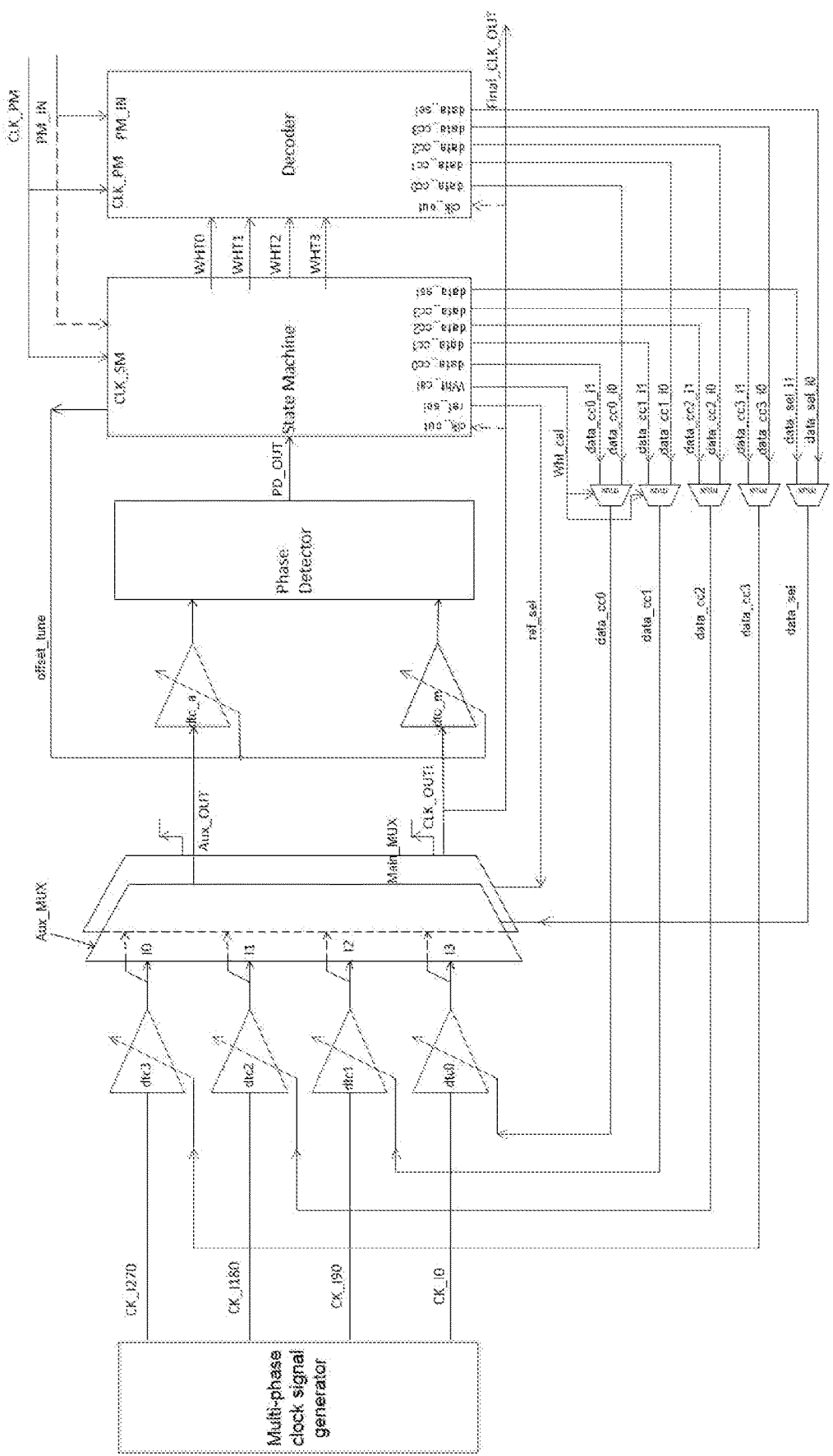
FIG. 6 is a schematic diagram of a multi-phase clock signal phase difference detection and calculation circuit applied to a phase modulator according to one embodiment of the present disclosure.

Then, as shown in FIG. 6, after the decoder recodes the input digital phase signal PM_IN according to the detected and calculated phase differences, it can cancel the phase mismatch in the digital domain; meanwhile, the state machine controls a control terminal of a signal selector mux, makings data_cc0, data_cc1, and data_sel to be controlled by outputs of decoder.

It is worth noting that in FIG. 5 and FIG. 6, the signal output by the second signal selector MUX_2 of the main digital-to-time conversion circuit is the system's final output signal Final_CLK_OUT.

Another embodiment of the present disclosure provides a digital-to-time conversion system. The digital-to-time conversion circuit includes a decoder, a multi-phase clock signal generator, a multi-phase clock signal phase difference detection and calculation circuit according to one of above embodiments. After recoding, by an decoder, the input digital phase signal PM_IN according to the detected and calculated phase difference, the phase mismatch in the digital domain can be canceled.

Figure 7:
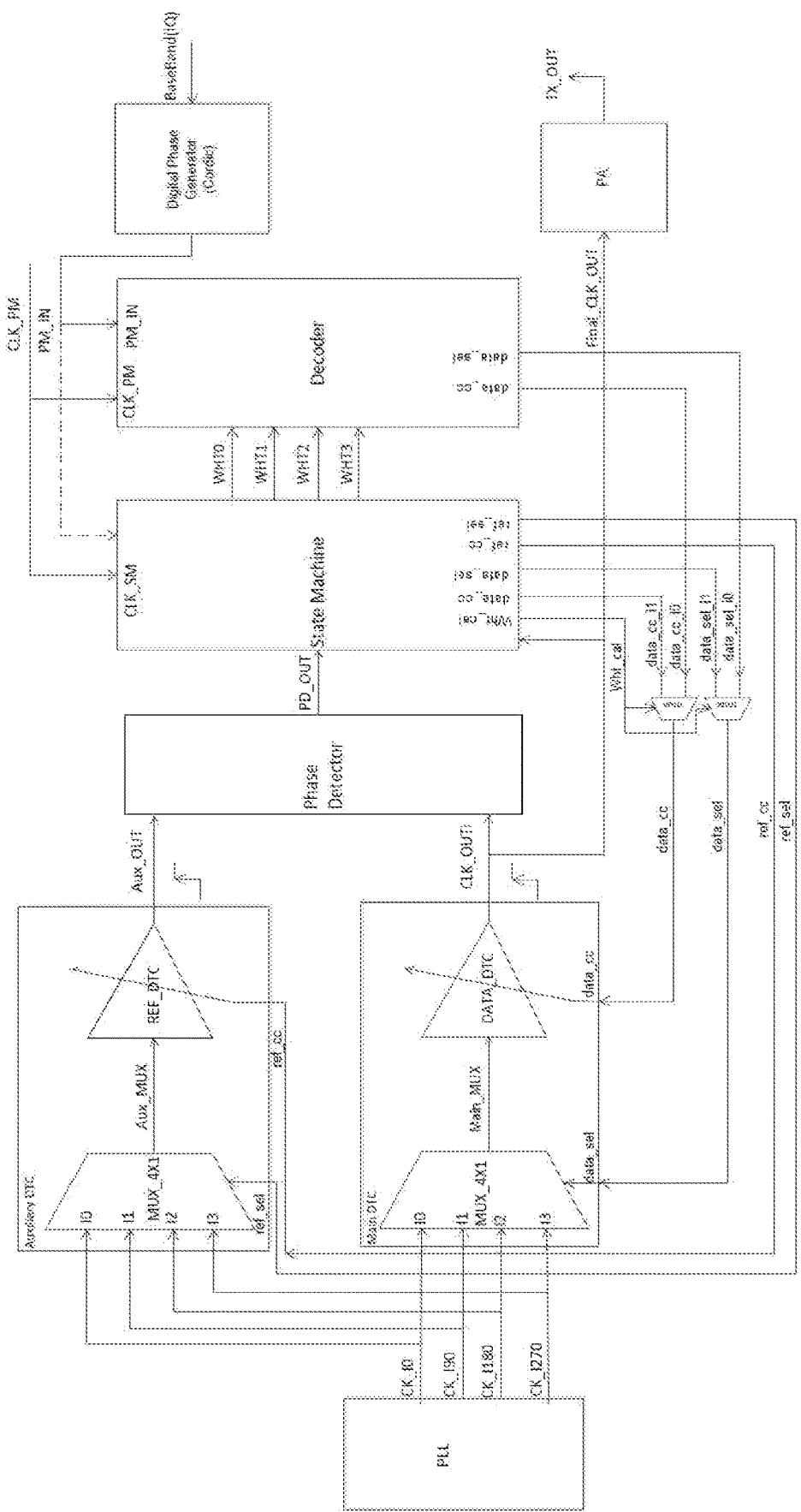
FIG. 7 is a schematic diagram of a digital-to-time conversion system applied to a phase modulator of transmitter according to one embodiment of the present disclosure.

FIG. 7 shows an example of a digital-to-time conversion system as applied in a transmitter phase modulator. As shown in FIG. 7, the transmitter phase modulator includes a digital-to-time conversion system, a digital phase generator for generating digital phase signal PM_IN connected to the decoder, and a power amplifier for receiving and amplifying a clock signal CLK_OUTi output by the main digital-to-time conversion circuit and outputting an amplified signal TX_OUT.

In addition, the clock signal phase difference detection and calculation circuit provided by the present disclosure can also be applied to other electronic circuits or systems such as phase-locked loops, clock data recovery circuits (CDR), phase difference circuits, fractional frequency dividers, and phase modulators.

Figure 8:
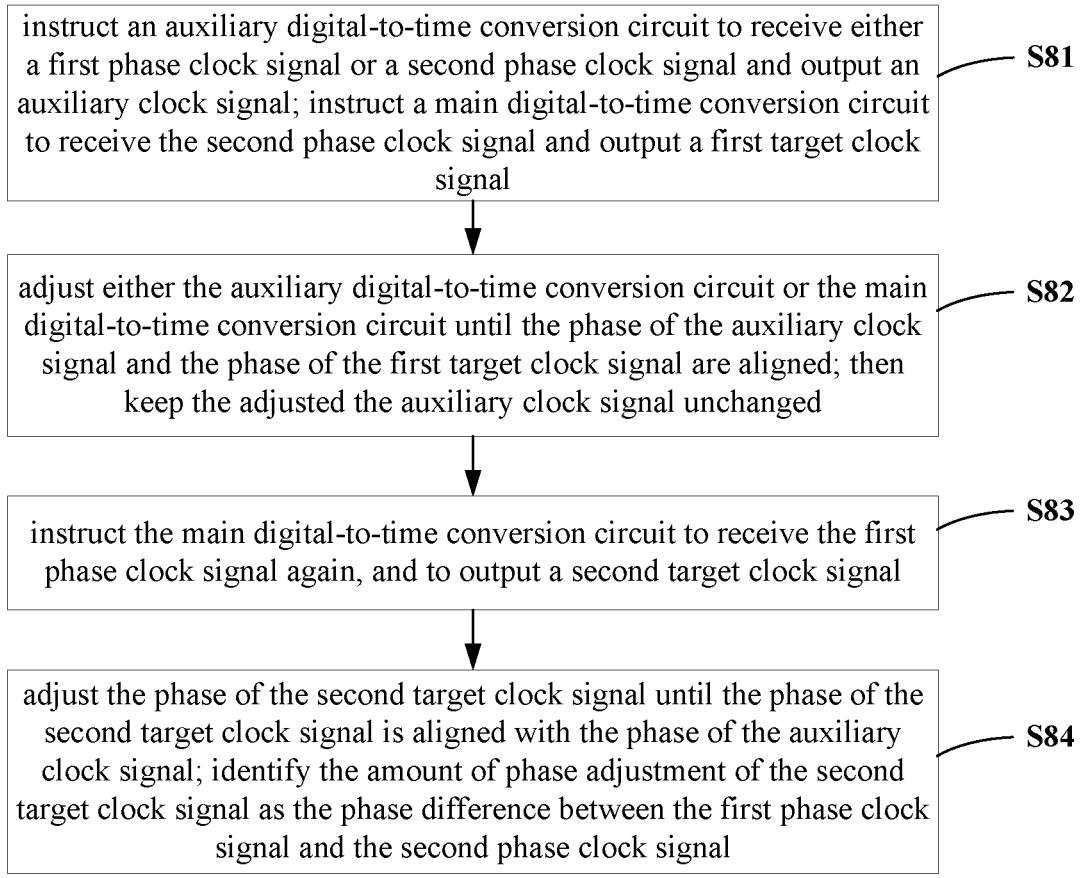
FIG. 8 is a flowchart showing the steps of a method of detecting and calculating phase difference of a clock signal according to an embodiment of the present disclosure.

As shown in FIG. 8, the present disclosure provides a method of detecting and calculating phase differences of multi-phase clock signals. The method can be performed by one or more embodiments illustrated by FIGS. 2 to 7. The method includes the following operations:

S81: selecting, by an auxiliary digital-to-time conversion circuit under control of a state machine, either a first phase clock signal or a second phase clock signal and outputting an auxiliary clock signal; selecting, by a main digital-to-time conversion circuit, the second phase clock signal and outputting a first target clock signal;

S82: adjusting either the auxiliary digital-to-time conversion circuit or the main digital-to-time conversion circuit until the phase of the auxiliary clock signal and the phase of the first target clock signal are aligned; then keeping the adjusted the auxiliary clock signal unchanged;

S83: selecting, by the main digital-to-time conversion circuit under control of the state machine, the first phase clock signal again, and outputting a second target clock signal;

S84: adjusting the phase of the second target clock signal until the phase of the second target clock signal is aligned with the phase of the auxiliary clock signal; identifying the amount of phase adjustment of the second target clock signal (i.e., the value of a delay control signal) as the phase difference between the first phase clock signal and the second phase clock signal.

In some embodiments, the method of detecting and calculating phase differences of multi-phase clock signals is performed by an embodiment illustrated by FIG. 3. More specifically, at S81, the method further includes: controlling a first signal selector to select the first phase clock signal and controlling a second signal selector to select the second phase clock signal.

In some embodiments, the method of detecting and calculating phase differences of multi-phase clock signals is performed by an embodiment illustrated by FIG. 5.

More specifically, at S81, the method further includes controlling the first signal selector to select the second phase clock signal and controlling the second signal selector to select the second phase clock signal; at S82, the method further includes adjusting either a first delay line or a second delay line until a phase detection result signal PD_OUT shows that the auxiliary clock signal Aux_OUT and the target clock signal CLK_OUT have aligned phases; at S84, the method further includes controlling control a delay circuit to adjust the phase of the second target clock signal.

More specially, at S82, the method further includes: detecting, by the phase detector, the phases of the auxiliary clock signal and the first target clock signal and outputting a first phase detection result signal; and, according to the first phase detection result signal, controlling either the auxiliary digital-to-time conversion circuit or the auxiliary digital-to-time conversion circuit until the auxiliary clock signal and the first target clock signal have aligned phases. More specially, at S84, the method further includes: detecting, by the phase detector, phases of the second target clock signal and the first target clock signal, and outputting a second phase detection result signal; and, according to the second phase detection result signal, controlling the state machine to adjust the delay control signal, thereby adjusting the phase of the second target clock signal.

Figure 9:
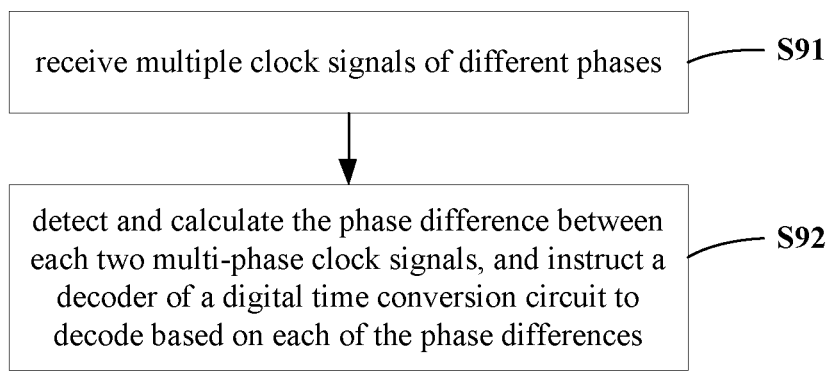
FIG. 9 is a flowchart showing the steps of a method for digital-to-time conversion according to an embodiment of the present disclosure.

As shown in FIG. 9, the present disclosure provides a method of modulating digital phases, which may be performed by one or more embodiments illustrated by FIG. 4 or FIG. 6, which includes the following operations:

S91: receiving multiple clock signals of different phases; and

S92: detecting and calculating the phase difference between each two multi-phase clock signals, and decoding by a decoder of a digital time conversion circuit based on each of the phase differences.

More specifically, S92 may include S81 to S84 in FIG. 8.

It should be noted that the circuits used to perform the method of detecting and calculating the phase difference of the clock signal of the present disclosure is not limited to the structures shown in FIGS. 2 to 7, and the circuits for performing the digital-to-time conversion of the present disclosure is not limited to FIGS. 4, 6 and 7. Reasonable modifications made by those skilled in the art based on the ideas of this disclosure should be regarded as within the scope of this disclosure.

It should be also noted that although the detection and calculation of adjacent phase differences are taken as an example herein to describe the multi-phase clock signal phase difference detection and calculation circuit and method of the present disclosure, the present disclosure is not limited by the example, and, for example, can also be applied to on-demand detection and calculation of phase differences between each two multi-phase clock signals of several multi-phase clock signals.

In summary, the present disclosure provides a meaningful solution to the phase mismatch problem and delay errors in digital time conversion circuits and/or digital phase modulation systems. It effectively overcomes various drawbacks of the prior art, and therefore has a high industrial value.

While particular elements, embodiments, and applications of the present invention have been shown and described, it is understood that the invention is not limited thereto because modifications may be made by those skilled in the art, particularly in light of the foregoing teaching. It is therefore contemplated by the appended claims to cover such modifications and incorporate those features which come within the spirit and scope of the invention.

We claim:

1. A multi-phase clock signal phase difference detection and calculation circuit, comprising:
    an auxiliary digital-to-time conversion circuit;
    a main digital-to-time conversion circuit;
    a phase detector,
        wherein an output terminal of the auxiliary digital-to-time conversion circuit and an output terminal of the main digital-to-time conversion circuit are respectively connected to an input terminal of the phase detector; and
    a state machine,
        wherein an output terminal of the phase detector is connected to an input terminal of the state machine,
        wherein an output terminal of the state machine is connected to a control terminal of the auxiliary digital-to-time conversion circuit and a control terminal of the main digital-to-time conversion circuit,
        wherein the auxiliary digital-to-time conversion circuit, under the control of the state machine, select one of a first phase clock signal and a second phase clock signal and outputs an auxiliary clock signal and adjust the phase of the auxiliary clock signal,
        wherein the main digital-to-time conversion circuit selects one of a first clock signal and a second clock signal under the control of the state machine,
        wherein the phase detector compares the phase of the auxiliary clock signal with the phase of a first target clock signal output by the main digital-to-time conversion circuit based on the selected second phase clock signal, and outputs a first phase detection result signal,
        wherein the state machine adjusts one of the auxiliary digital-to-time conversion circuit and the main digital-to-time conversion circuit according to the first phase detection result signal until the phase difference between the auxiliary clock signal and the first target clock signal is zero and keeps an adjusted auxiliary clock signal unchanged,
        wherein the phase detector compares the phase of the adjusted auxiliary clock signal with the phase of a second target clock signal output by the main digital-to-time conversion circuit based on the selected first phase clock signal, and outputs a second phase detection result signal,
        wherein the state machine adjusts a delay control signal according to the second phase detection result signal to adjust the phase of the second target clock signal until the adjusted auxiliary clock signal and the second target clock signal have a phase difference of zero according to the phase detector, and then the amount of phase adjustment of the second target clock signal is identified as a phase difference between the first phase clock signal and the second phase clock signal.

2. The multi-phase clock signal phase difference detection and calculation circuit according to claim 1,
    wherein the auxiliary digital-to-time conversion circuit includes a first signal selector and a first delay line, the output terminal of the state machine is connected to a control terminal of the first signal selector and a control terminal of the first delay line, an output terminal of the first signal selector is connected to an input terminal of the first delay line, and an output terminal of the first delay line is connected to the input terminal of the phase detector,
    wherein the main digital-to-time conversion circuit includes a second signal selector and a second delay line, the output terminal of the state machine is connected to a control terminal of the second signal selector and a control terminal of the second delay line, an output terminal of the second delay line is connected to the input terminal of the phase detector.

3. The multi-phase clock signal phase difference detection and calculation circuit according to claim 2,
wherein the auxiliary digital-to-time conversion circuit selects the first phase lock signal and outputs the auxiliary clock signal,
wherein the main digital-to-time conversion circuit selects the second phase lock signal and outputs the first target clock signal.

4. The multi-phase clock signal phase difference detection and calculation circuit according to claim 3, wherein the state machine adjusts the auxiliary digital-to-time conversion circuit to adjust the auxiliary clock signal according to the first phase detection result signal, until the phase difference between the auxiliary clock signal and the first target clock signal is zero.

5. The multi-phase clock signal phase difference detection and calculation circuit according to claim 4, wherein the state machine adjusts the delay control signal to control the second delay line according to the second phase detection result signal, the second delay line adjusts the phase of the second target clock signal accordingly until the adjusted auxiliary clock signal and the second target clock signal have a phase difference of zero, and then the amount of phase adjustment of the second target clock signal is identified as a phase difference between the first phase clock signal and the second phase clock signal.

6. The multi-phase clock signal phase difference detection and calculation circuit according to claim 2, further comprising:
a delay circuit, which includes a plurality of third delay lines, wherein each of the plurality of third delay lines receives one phase clock signal of multi-phase clock signals, wherein the auxiliary digital-to-time conversion circuit and the main digital-to-time conversion circuit are connected to an output terminal of the delay circuit, wherein the state machine is connected to a control terminal of the delay circuit to adjust the delay control signal to control the delay circuit.

7. The multi-phase clock signal phase difference detection and calculation circuit according to claim 6, wherein the number of third delay lines is equal to the number of phases in the multi-phase clock signal.

8. The multi-phase clock signal phase difference detection and calculation circuit according to claim 7,
wherein the auxiliary digital-to-time conversion circuit selects the second phase clock signal from the third delay lines and outputs the auxiliary clock signal,
wherein the main digital-to-time conversion circuit selects the second phase clock signal from the third delay lines and outputs the first target clock signal,
wherein the state machine adjusts the auxiliary digital-to-time conversion circuit or the main digital-to-time conversion circuit according to the first phase detection result signal to adjust the phase of the auxiliary phase signal or the first target clock signal, until the auxiliary phase signal and the first target clock signal have a phase difference of zero.

9. The multi-phase clock signal phase difference detection and calculation circuit according to claim 8, wherein the auxiliary digital-to-time conversion circuit and a control line of one of the third delay lines selected by the auxiliary digital-to-time conversion circuit stays the same to keep the phase of the auxiliary clock signal unchanged; and the main digital-to-time conversion circuit receives the first phase clock signal from the third delay lines and outputs the second target clock signal.

10. The multi-phase clock signal phase difference detection and calculation circuit according to claim 9, wherein the state machine adjusts the delay control signal to control the third delay line according to the second phase detection result signal, the third delay lines adjust the phase of the second target clock signal accordingly until the adjusted auxiliary clock signal and the second target clock signal have a phase difference of zero, and then the amount of phase adjustment of the third delay lines is identified as a phase difference between the first phase clock signal and the second phase clock signal.

11. A digital-to-time conversion system, comprising:
a decoder;
a multi-phase clock signal generator, which outputs clock signals with different phases included in one clock signal; and
a multi-phase clock signal phase difference detection and calculation circuit, which detects and calculates a phase difference between each two of a plurality of phase clock signals, wherein the multi-phase clock signal phase difference detection and calculation circuit comprises:
an auxiliary digital-to-time conversion circuit;
a main digital-to-time conversion circuit;
a phase detector,
wherein an output terminal of the auxiliary digital-to-time conversion circuit and an output terminal of the main digital-to-time conversion circuit are respectively connected to an input terminal of the phase detector; and
a state machine,
wherein an output terminal of the phase detector is connected to an input terminal of the state machine,
wherein an output terminal of the state machine is connected to a control terminal of the auxiliary digital-to-time conversion circuit and a control terminal of the main digital-to-time conversion circuit,
wherein the auxiliary digital-to-time conversion circuit selects one of a first phase clock signal and a second phase clock signal and outputs an auxiliary clock signal under the control of the state machine, and adjusts the phase of the auxiliary clock signal,
wherein the main digital-to-time conversion circuit selects one of a first clock signal and a second clock signal under the control of the state machine,
wherein the phase detector compares the phase of the auxiliary clock signal with the phase of a first target clock signal output by the main digital-to-time conversion circuit based on the second phase clock signal as input, and outputs a first phase detection result signal,
wherein the state machine adjusts one of the auxiliary digital-to-time conversion circuit and the main digital-to-time conversion circuit according to the first phase detection result signal until the phase difference between the auxiliary clock signal and the first target clock signal is zero and keeps an adjusted auxiliary clock signal unchanged, wherein the phase detector compares the phase of the adjusted auxiliary clock signal with the phase of a second target clock signal output by the main digital-to-time conversion circuit based on the first phase clock signal as input, and outputs a second phase detection result signal, wherein the state machine adjusts a delay control signal according to the second phase detection result signal to adjust the phase of the second target clock signal until the adjusted auxiliary clock signal and the second target clock signal have a phase difference of zero according to the phase detector, and then the amount of phase adjustment of the second target clock signal is identified as a phase difference between the first phase clock signal and the second phase clock signal;

wherein the decoder receives the phase difference and decodes based on the phase difference to cancel out the phase mismatch in the digital domain.

12. A method of detecting and calculating phase differences of multi-phase clock signals, comprising:

receiving, by an auxiliary digital-to-time conversion circuit, one of a first phase clock signal and a second phase clock signal, and outputting an auxiliary clock signal;

receiving, by a main digital-to-time conversion circuit, a second phase clock signal, and outputting a first target clock signal;

adjusting one of the auxiliary digital-to-time conversion circuit and the main digital-to-time conversion circuit until the phase difference between the auxiliary clock signal and the first target clock signal is zero, and keeping the adjusted auxiliary clock signal unchanged;

receiving, by the main digital-to-time conversion circuit, the first phase clock signal again and outputting a second target clock signal;

adjusting the phase of the second target clock signal until the phase difference between the second target clock signal and the adjusted auxiliary clock signal is zero; and identifying the amount of phase adjustment of the second target clock signal as a calculated phase difference between the first phase clock signal and the second phase clock signal.

13. The method of detecting and calculating phase differences of the multi-phase clock signals according to claim 12, further comprising:

detecting the phase of the auxiliary clock signal and the phase of the first target clock signal by the phase detector, and outputting a first phase detection result signal;

adjusting one of the auxiliary digital-to-time conversion circuit and the main digital-to-time conversion circuit by the state machine according to the first phase detection result signal, until the phase difference between the auxiliary clock signal and the first target clock signal is zero;

detecting the phase of the second target clock signal and the phase of the adjusted auxiliary clock signal by the phase detector, and outputting a second phase detection result signal; and adjusting a delay control signal by the state machine according to the second phase detection result signal to adjust the phase of the second target clock signal.

14. The method of detecting and calculating phase differences of the multi-phase clock signals according to claim 13, the receiving, by the auxiliary digital-to-time conversion circuit, one of the first phase clock signal and the second phase clock signal, and outputting the auxiliary clock signal further comprises:

receiving, by the auxiliary digital-to-time conversion circuit, the first phase clock signal and outputting the auxiliary clock signal.

15. The method of detecting and calculating phase differences of the multi-phase clock signals according to claim 14, the adjusting the delay control signal by the state machine according to the second detection result signal to adjust the phase of the second target clock signal further comprises:

adjusting the delay control signal by the state machine according to the second phase detection result signal to control the main digital-to-time conversion circuit to adjust the phase of the second target clock signal.

16. The method of detecting and calculating phase differences of the multi-phase clock signals according to claim 13, the receiving, by the auxiliary digital-to-time conversion circuit, one of the first phase clock signal and the second phase clock signal, and outputting the auxiliary clock signal further comprises:

receiving, by the auxiliary digital-to-time conversion circuit, the second phase clock signal and outputting the auxiliary clock signal.

17. The method of detecting and calculating phase differences of the multi-phase clock signals according to claim 16, the adjusting the delay control signal by the state machine according to the second phase detection result signal to adjust the phase of the second target clock signal comprises:

adjusting the delay control signal by the state machine according to the second detection result signal to control a delay circuit to adjust the phase of the second target clock signal, wherein the delay circuit is connected to an input terminal of the main digital-to-time conversion circuit.

* * * * *